US011411058B2

(12) United States Patent
Xu et al.

(10) Patent No.: US 11,411,058 B2
(45) Date of Patent: Aug. 9, 2022

(54) FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Bin Xu, Hubei (CN); Hongyu Xu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 567 days.

(21) Appl. No.: 16/471,915

(22) PCT Filed: Feb. 20, 2019

(86) PCT No.: PCT/CN2019/075508
§ 371 (c)(1),
(2) Date: Jun. 20, 2019

(87) PCT Pub. No.: WO2020/124765
PCT Pub. Date: Jun. 25, 2020

(65) Prior Publication Data
US 2021/0359242 A1    Nov. 18, 2021

(30) Foreign Application Priority Data
Dec. 21, 2018 (CN) .......................... 201811574506.8

(51) Int. Cl.
H01L 23/498 (2006.01)
H01L 27/32 (2006.01)
H01L 51/52 (2006.01)
H05K 1/18 (2006.01)
H01L 51/00 (2006.01)

(52) U.S. Cl.
CPC ...... *H01L 27/3244* (2013.01); *H01L 51/0097* (2013.01); *H01L 51/52* (2013.01);
(Continued)

(58) Field of Classification Search
CPC . H01L 27/32; H01L 27/3223; H01L 27/3225; H01L 27/3276; H01L 27/3288;
(Continued)

(56) References Cited

U.S. PATENT DOCUMENTS 9,287,329 B1 *   3/2016  Lee ..................... H01L 27/1218
10,312,313 B2 *  6/2019  Oh ........................ H05K 1/189
(Continued)

FOREIGN PATENT DOCUMENTS

CN    204516283 U    7/2015
CN    107425142 A    12/2017
(Continued)

*Primary Examiner* — Eduardo A Rodela

(57) ABSTRACT

A flexible display device includes a flexible display panel and a chip on film (COF) bonded to the flexible display panel; wherein the flexible display panel is divided into a display region, a bonding region on a side of the display region, and a bending region between the display region and the bonding region; wherein the COF comprises a main body portion and two expansion bonding portions respectively disposed at two ends of one side of the main body portion; wherein an edge of the main body portion adjacent to the two expansion bonding portions are disposed with a plurality of connection pins; wherein the COF is bonded to the bonding region of the flexible display panel through the plurality of connection pins.

7 Claims, 3 Drawing Sheets

(52) U.S. Cl.
CPC ...... *H05K 1/189* (2013.01); *H01L 2251/5338* (2013.01); *H05K 2201/10128* (2013.01)

(58) Field of Classification Search
CPC ... H01L 23/13; H01L 23/31; H01L 23/49524; H01L 23/49572; H01L 23/4985; H01L 24/50; H01L 51/52; H01L 27/3244; H01L 51/0097; H01L 2251/5338; H05K 1/189; H05K 2201/10128
See application file for complete search history.

(56) References Cited

U.S. PATENT DOCUMENTS

| | | | | |
|---|---|---|---|---|
| 11,024,828 | B2* | 6/2021 | Kim | H01L 51/5253 |
| 11,188,164 | B2* | 11/2021 | Eom | G06F 3/04164 |
| 11,209,922 | B2* | 12/2021 | Kim | G02F 1/133308 |
| 2014/0217382 | A1* | 8/2014 | Kwon | H01L 51/5246 257/40 |
| 2016/0062525 | A1* | 3/2016 | Kim | G02F 1/13452 345/173 |
| 2016/0093644 | A1* | 3/2016 | Ki | H01L 27/1244 257/40 |
| 2017/0263891 | A1* | 9/2017 | Oh | H01L 51/52 |
| 2018/0026227 | A1* | 1/2018 | Kim | H01L 51/0097 257/40 |
| 2018/0062090 | A1* | 3/2018 | Kim | H01L 51/5259 |
| 2019/0012007 | A1* | 1/2019 | Kim | H01L 27/3225 |

FOREIGN PATENT DOCUMENTS

| | | |
|---|---|---|
| CN | 107799050 A | 3/2018 |
| CN | 108445590 A | 8/2018 |
| JP | 2009238926 A | 10/2009 |

\* cited by examiner

FLEXIBLE DISPLAY DEVICE

CROSS REFERENCE TO RELATED APPLICATION

This application claims the priority of International Application No. PCT/CN2019/075508, filed on 2019 Feb. 20, which claims priority to Chinese Application No. 201811574506.8, filed on 2018 Dec. 21. The entire disclosures of each of the above applications are incorporated herein by reference.

BACKGROUND OF INVENTION

Field of Invention

The present invention relates to the field of display technologies, and in particular, to a flexible display device.

Description of Prior Art

Current flat panel display devices on the market include liquid crystal displays (LCDs) and organic light emitting diode (OLED) displays. Among them, OLED displays have many excellent characteristics, such as self-illumination, high brightness, wide viewing angles, high contrast, flexibility, low energy consumption, rich color, fast response times, and flexible screen preparation, etc., which have aroused great interest in the field of scientific research and industry and are considered to be the next-generation display technology. OLED displays gradually replace traditional LCDs and are widely used in mobile phone screens, computer monitors, and full-color TVs.

Existing flat panel displays generally include a display panel and an external circuit. When the display panel is normally displayed, an external circuit, such as a flexible printed circuit (FPC) and a chip on film (COF), is required. The external circuit is connected to an outer lead bonding (OLB) area of the panel by leads. An electrical connection between the external circuit and the OLB area of the display panel is connected by a bonding process to transmit a driving signal to each signal line in the display panel.

Taking mobile phones as an example, if an overall size of a mobile phone is large and an actual display region is small, users may get bored. Therefore, consumers always pursue a mobile phone with a larger screen and a higher screen ratio. Nowadays, "full screen" mobile phones have become mainstream in production, all suppliers are focused on developing comprehensive screen products with relatively high screen ratios. OLED displays play a vital role in full-screen display production for they can be flexible.

FIG. 1 is a schematic diagram of a conventional flexible OLED display including a flexible OLED panel 100 and a COF 200 bonded to the flexible OLED panel 100. A bottom end of the flexible OLED panel 100 is provided with a bonding region 110, and the COF 200 is bonded to the bonding region 110 of the flexible OLED panel 100. As shown in FIG. 2, the bonding region 110 of the flexible OLED panel 100 is bent toward the back surface of the flexible OLED panel 100 by a bending region 120 to be located on the back surface of a display region 130 to reduce a border width of the display device and increase the screen ratio. As shown in FIG. 3, in the bonding process, the COF 200 forms a bonding structure by a plurality of connection pins 250 disposed at the top edge thereof and a plurality of bonding terminals disposed at the lowermost edge of the bonding region 110 to achieve bonding. To ensure the alignment accuracy of the bonding, a minimum space between bonding terminals of the bonding region 110 should be limited. As the resolution (pixels per inch, PPI) of the display panel becomes higher and higher, the width of a connection area of the bonding region 110 and the COF 200 at the lower end of the display panel becomes larger and larger. However, the actual display screen width does not change much, thus limiting the width of the bonding region 110 at the lower end of the display panel.

SUMMARY OF INVENTION

An object of the present invention is to provide a flexible display device capable of increasing the number of connection pins while ensuring the bonding accuracy and without increasing the width of the bonding region, thereby facilitating the improvement of the resolution of the flexible display device.

To achieve the above object, the present invention provides a flexible display device comprising a flexible display panel and a chip on film (COF) bonded to the flexible display panel;

wherein the flexible display panel is divided into a display region, a bonding region on a side of the display region, and a bending region between the display region and the bonding region;

wherein the COF comprises a main body portion and two expansion bonding portions respectively disposed at two ends of one side of the main body portion;

wherein an edge of the main body portion adjacent to the two expansion bonding portions are disposed with a plurality of connection pins;

wherein the COF is bonded to the bonding region of the flexible display panel through the plurality of connection pins.

The two expansion bonding portions are respectively bound to two edges of the bonding region connecting to the bending region.

The two expansion bonding portions are respectively attached to two edges of the bonding region connecting to the bending region.

The two expansion bonding portions respectively extend above the bending region along two edges of the bonding region connecting to the bending region, so as to be attached to the bonding region and the bending region;

wherein a portion of each of the expansion bonding portions that is attached to the bending portion is bent together with the bending portion.

The flexible display device further comprising a flexible circuit board electrically connected to the COF.

The main body portion of the COF is provided with a driving chip electrically connected to the plurality of connection pins.

The flexible display panel comprises a flexible substrate and a plurality of bonding terminals corresponding to the bonding region disposed on the flexible substrate;

wherein the plurality of bonding terminals are in one-to-one correspondence with the plurality of connection pins;

wherein the flexible display panel is bound to the COF by the plurality of bonding terminals.

The flexible substrate is a polyimide substrate.

The flexible display panel is an organic light emitting diode (OLED) display panel.

The COF is bonded to the bonding region of the flexible display panel through an anisotropic conductive paste.

The present invention provides a flexible display device comprising a flexible display panel and a chip on film (COF)

bonded to the flexible display panel. The flexible display panel is divided into a display region, a bonding region on a side of the display region, and a bending region between the display region and the bonding region, the COF comprises a main body portion and two expansion bonding portions respectively disposed at two ends of one side of the main body portion, an edge of the main body portion adjacent to the two expansion bonding portions are disposed with a plurality of connection pins, and the COF is bonded to the bonding region of the flexible display panel through the plurality of connection pins. The invention adds an expansion bonding portion at both ends of the main body portion by changing the shape of the COF. According to the invention, the existing COF in which connection pins only provided at one side edge of the bonding region is replaced by a COF in which connection pins provided at three side edges of the bonding region. In the case of ensuring the bonding precision and not increasing the width of the bonding region, the present invention can increase the number of connection pins correspondingly, thereby improving the resolution of the flexible display device.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

In order to further clarify the technical means and effects of the present invention, the following detailed description will be made in conjunction with the preferred embodiments of the invention and the accompanying drawings.

Figure 1:
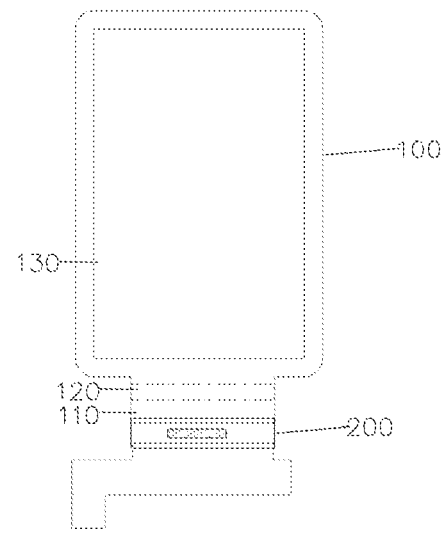
FIG. 1 is a plane structural diagram of a conventional flexible organic light emitting diode (OLED) display.
Figure 2:
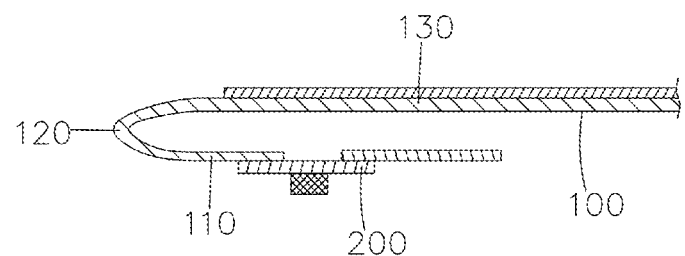
FIG. 2 is a lateral diagram of the flexible OLED display of FIG. 1.
Figure 3:
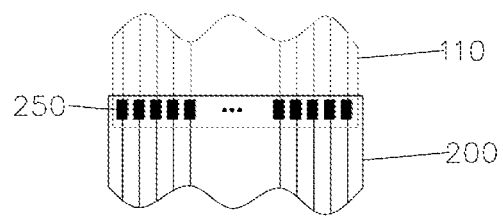
FIG. 3 is a partially enlarged diagram of a COF and a bonding region in the flexible OLED display of FIG. 1.
Figure 4:
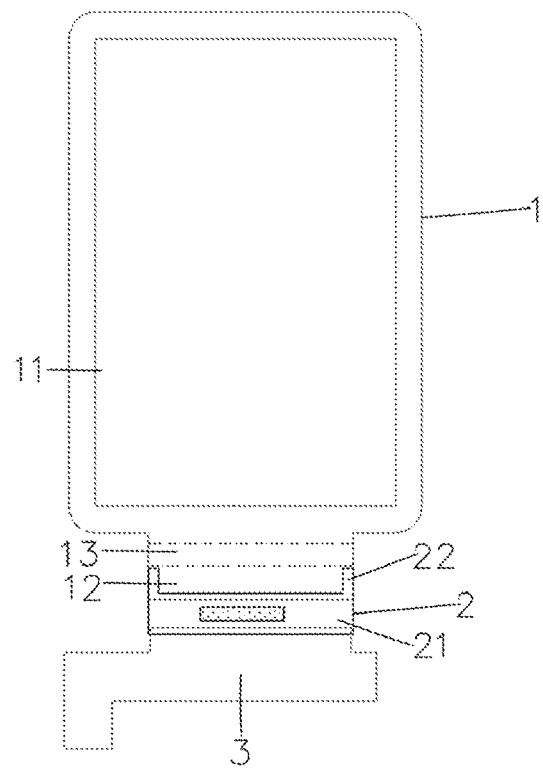
FIG. 4 is a plane structural diagram of a flexible display device according to the first embodiment of the present invention.
Figure 5:
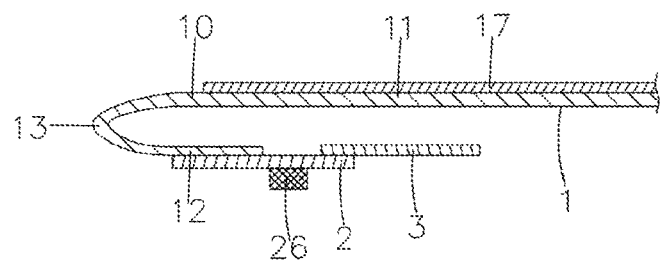
FIG. 5 is a lateral diagram of a flexible display device according to the first embodiment of the present invention.

Referring to FIG. 4-5, a flexible display device of a first embodiment of the present invention includes a flexible display panel 1, a chip on film (COF) 2 bonded to the flexible display panel 1, and a flexible printed circuit (FPC) 3 electrically connected to the COF 2.

The flexible display panel 1 is divided into a display region 11, a bonding region 12 on a side of the display region 11, and a bending region 13 between the display region 11 and the bonding region 12.

Figure 7:
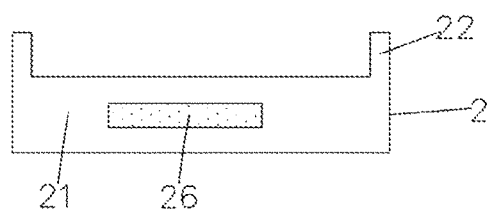
FIG. 7 is a structural diagram of the COF of the flexible display device according to the first embodiment of the present invention.

As shown in FIG. 7, the COF 2 includes a main body portion 21 and two expansion bonding portions 22 respectively disposed at two ends of one side of the main body portion 21

Figure 6:
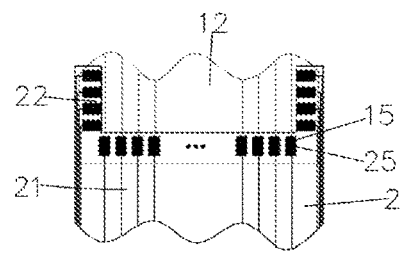
FIG. 6 is a partially enlarged diagram of a COF and a bonding region according to the first embodiment of the present invention.

As shown in FIG. 6, an edge of the main body portion 21 adjacent to the two expansion bonding portions 22 are disposed with a plurality of connection pins 25. The COF 2 is bonded to the bonding region 12 of the flexible display panel 1 through the plurality of connection pins 25.

The two expansion bonding portions 22 are respectively bound to two edges of the bonding region 12 connecting to the bending region 13.

The two expansion bonding portions 22 are respectively attached to two edges of the bonding region 12 connecting to the bending region 13.

The main body portion 21 of the COF 2 is provided with a driving chip 26 electrically connected to the plurality of connection pins 25.

Specifically, the flexible display panel 1 is an OLED display panel. The OLED display panel includes a flexible substrate 10, a plurality of bonding terminals 15 corresponding to the bonding region 12 disposed on the flexible substrate 10, and a thin film transistor (TFT) array layer 17 and an OLED device layer which are sequentially disposed on the flexible substrate 10 corresponding to the display region 11, and circuit traces corresponding to the bonding region 12 and the bending region 13 and electrically connected to the bonding terminals 15 and the TFT array layer 17. The back surface of the flexible display panel 1 is the side of the flexible substrate 10 away from the TFT array layer, and the front surface of the flexible display panel 1 is the side opposite to the back surface.

Specifically, the bonding region 12 is located on the back surface of the display region 11 by bending the bending region 13, the COF 2 and the flexible circuit board 3 are also located on the back surface of the display region 11, thereby reducing the boundary width of the flexible display device and increasing the screen ratio.

Specifically, the plurality of bonding terminals 15 are disposed in one-to-one correspondence with the plurality of connection pins 25. The flexible display panel 1 is bonded to the COF 2 through the plurality of bonding terminals 15.

Specifically, the flexible substrate 10 could be, but not limited to, a polyimide (PI) substrate.

Specifically, the TFT array layer includes a plurality of TFTs, and the plurality of TFTs could be indium gallium zinc oxide semiconductor TFTs or low temperature polysilicon TFTs. Of course, other TFTs commonly used in the prior art could also be used here.

Specifically, the COF 2 is bonded to the bonding region 12 of the flexible display panel 1 through an anisotropic conductive paste.

The first embodiment of the present invention adds an expansion bonding portion at both ends of the main body portion by changing the shape of the COF. According to the invention, the existing COF in which connection pins only provided at one side edge of the bonding region is replaced by a COF in which connection pins provided at three side edges of the bonding region. In the case of ensuring the bonding precision and not increasing the width of the bonding region, the present invention can increase the number of connection pins correspondingly, thereby improving the resolution of the flexible display device.

Figure 8:
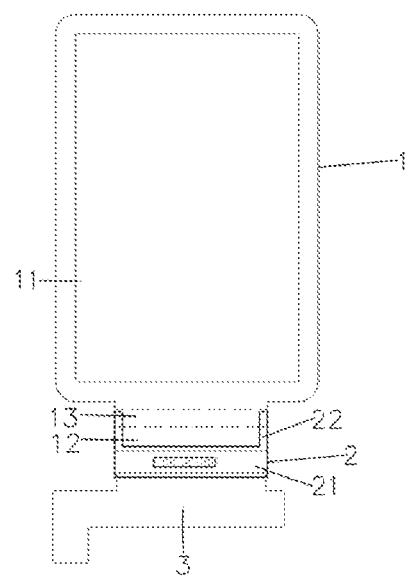
FIG. 8 is a plane diagram showing a flexible display device according to a second embodiment of the present invention.
Figure 9:
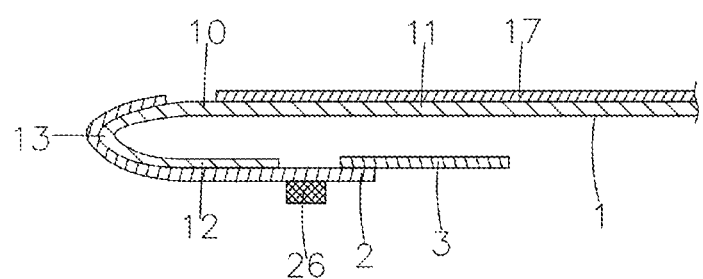
FIG. 9 is a lateral diagram of the flexible display device according to the second embodiment of the present invention.

Referring to FIG. 8 and FIG. 9, a flexible display device of a second embodiment of the present invention is provided. The second embodiment differs from the first embodiment described above in that: the two expansion bonding portions 22 respectively extend above the bending region 13 along the two side edges of the bonding region 12 connecting bending regions 13 and attached to the bonding region 12 and the bending region 13. A portion of each expansion bonding portion 22 correspondingly attached to the bending region 13 is bent together with the bending region 13. Other technical features are the same as those of the first embodiment described above and are not described herein again.

In the flexible display device of the second embodiment of the present invention, the two expansion bonding portions 22 respectively extend above the bending region 13 along the two side edges of the bonding region 12 connecting bending regions 13 and a portion of each expansion bonding portion 22 correspondingly attached to the bending region 13 is bent together with the bending region 13. The second embodiment of the present invention can further increase the number of connection pins 25. Because the COF 2 is flexible, the two expansion bonding portions 22 can also support the bending region 3 as two important supporting members, thereby the stress of the bending region 3 is reduced.

To sum up, the present invention provides a flexible display device comprising a flexible display panel and a chip on film (COF) bonded to the flexible display panel. The flexible display panel is divided into a display region, a bonding region on a side of the display region, and a bending region between the display region and the bonding region, the COF comprises a main body portion and two expansion bonding portions respectively disposed at two ends of one side of the main body portion, an edge of the main body portion adjacent to the two expansion bonding portions are disposed with a plurality of connection pins, and the COF is bonded to the bonding region of the flexible display panel through the plurality of connection pins. The invention adds an expansion bonding portion at both ends of the main body portion by changing the shape of the COF. According to the invention, the existing COF in which connection pins only provided at one side edge of the bonding region is replaced by a COF in which connection pins provided at three side edges of the bonding region. In the case of ensuring the bonding precision and not increasing the width of the bonding region, the present invention can increase the number of connection pins correspondingly, thereby improving the resolution of the flexible display device.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A flexible display device, comprising a flexible display panel and a chip-on-film (COF) structure bonded to the flexible display panel;
    wherein the flexible display panel is divided into a display region, a bonding region on a side of the display region, and a bending region between the display region and the bonding region;
    wherein the COF structure comprises a film structure comprising a main body portion and two expansion bonding portions respectively disposed at two ends of one side of the main body portion, wherein the two expansion bonding portions are bound to two edges of the bonding region connecting to the bending region, respectively, and extend above the bending region along the two edges of the bonding region, so that the expansion bonding portions are attached to the bonding region and the bending region, wherein a portion of each of the expansion bonding portions that is attached to the bending region is bent together with the bending region;
    wherein an edge of the main body portion adjacent to the two expansion bonding portions and the expansion bonding portions are disposed with a plurality of connection pins;
    wherein the COF structure is bonded to the bonding region of the flexible display panel through the plurality of connection pins.

2. The flexible display device according to claim 1, further comprising a flexible circuit board electrically connected to the COF structure.

3. The flexible display device according to claim 1, wherein the main body portion of the COF structure is provided with a driving chip electrically connected to the plurality of connection pins.

4. The flexible display device according to claim 1, wherein the flexible display panel comprises a flexible substrate and a plurality of bonding terminals corresponding to the bonding region disposed on the flexible substrate;
    wherein the plurality of bonding terminals are in one-to-one correspondence with the plurality of connection pins;
    wherein the flexible display panel is bound to the COF structure by the plurality of bonding terminals.

5. The flexible display device according to claim 4, wherein the flexible substrate is a polyimide substrate.

6. The flexible display device according to claim 1, wherein the flexible display panel is an organic light emitting diode (OLED) display panel.

7. The flexible display device according to claim 1, wherein the COF structure is bonded to the bonding region of the flexible display panel through an anisotropic conductive paste.

* * * * *